United States Patent
Yano et al.

(10) Patent No.: US 7,286,398 B2
(45) Date of Patent: Oct. 23, 2007

(54) SEMICONDUCTOR DEVICE AND METHOD OF CONTROLLING SAID SEMICONDUCTOR DEVICE

(75) Inventors: Masaru Yano, Tokyo (JP); Minoru Aoki, Tokyo (JP)

(73) Assignee: Spansion LLC, Sunnyvale, CA (US)

( * ) Notice: Subject to any disclaimer, the term of this patent is extended or adjusted under 35 U.S.C. 154(b) by 0 days.

(21) Appl. No.: 11/290,002

(22) Filed: Nov. 30, 2005

(65) Prior Publication Data

US 2006/0215451 A1 Sep. 28, 2006

Related U.S. Application Data

(63) Continuation of application No. PCT/JP2004/017807, filed on Nov. 30, 2004.

(51) Int. Cl.
G11C 11/34 (2006.01)
G11C 8/00 (2006.01)

(52) U.S. Cl. .................. 365/185.04; 365/185.05; 365/185.16; 365/185.17; 365/230.03

(58) Field of Classification Search .......... 365/185.04, 365/185.05, 185.16, 185.17, 230.03
See application file for complete search history.

(56) References Cited

U.S. PATENT DOCUMENTS

| | | | | |
|---|---|---|---|---|
| 5,381,369 A | * | 1/1995 | Kikuchi et al. | 365/185.04 |
| 5,920,504 A | * | 7/1999 | Lee et al. | 365/185.11 |
| 6,026,016 A | * | 2/2000 | Gafken | 365/185.04 |
| 6,061,280 A | | 5/2000 | Aritome | 365/195 |
| 6,292,422 B1 | * | 9/2001 | Pitts | 365/225.7 |
| 6,567,312 B1 | | 5/2003 | Torii et al. | 365/185.28 |
| 6,819,622 B2 | * | 11/2004 | Roohparvar et al. | 365/228 |
| 6,822,899 B1 | * | 11/2004 | Boulos et al. | 365/185.09 |
| 7,145,799 B2 | * | 12/2006 | Naso et al. | 365/185.04 |
| 2004/0141379 A1 | * | 7/2004 | La Malfa et al. | 365/185.33 |
| 2005/0276125 A1 | * | 12/2005 | Kido et al. | 365/189.05 |
| 2006/0067099 A1 | * | 3/2006 | Kim et al. | 365/94 |
| 2006/0176740 A1 | * | 8/2006 | Kim et al. | 365/185.33 |
| 2006/0215451 A1 | * | 9/2006 | Yano et al. | 365/185.04 |

FOREIGN PATENT DOCUMENTS

| | | | | |
|---|---|---|---|---|
| JP | 09134309 A | * | 5/1997 | |
| JP | 10-199265 | | 7/1998 | |
| JP | 10199270 A | * | 7/1998 | |
| JP | 11-086571 | | 3/1999 | |
| JP | 2001-518696 | | 10/2001 | |
| JP | 2001-308209 | | 11/2001 | |
| JP | 2001-325793 | | 11/2001 | |
| JP | 2003-204000 | | 7/2003 | |
| WO | WO 99/17294 | | 4/1999 | |

* cited by examiner

Primary Examiner—Lý Duy Pham

(57) ABSTRACT

A semiconductor device includes: groups of memory cells that are connected to word lines; and select gates that are controlled by control word lines and are connected to the groups of memory cells, each of the select gates being capable of storing protection information for a respective one of the groups of memory cells.

15 Claims, 15 Drawing Sheets

FG-type memory cell select gate

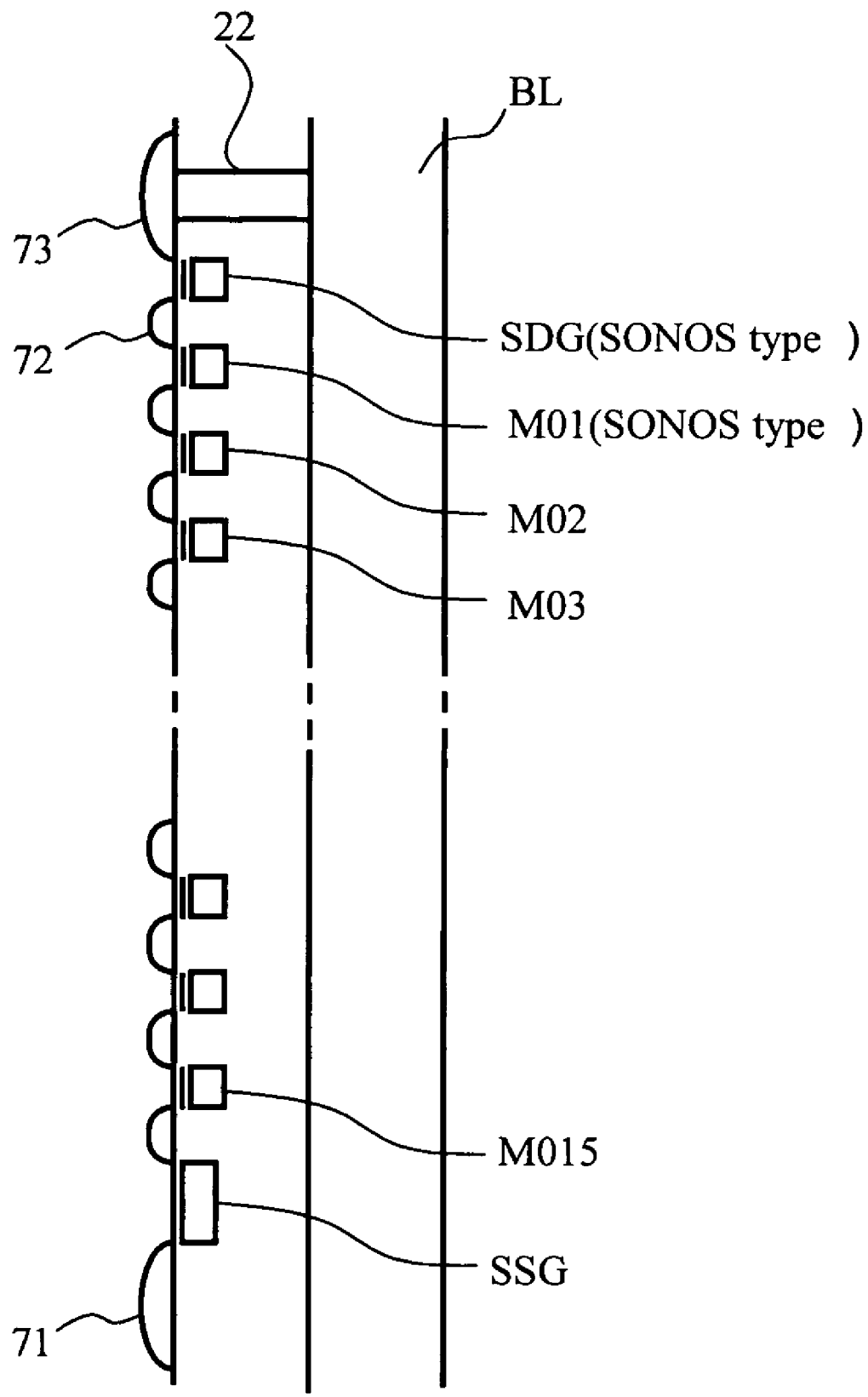

SONOS-type memory cell

SONOS-type select drain gate

SEMICONDUCTOR DEVICE AND METHOD OF CONTROLLING SAID SEMICONDUCTOR DEVICE

CROSS REFERENCE TO RELATED APPLICATIONS

This is a continuation of International Application No. PCT/JP2004/017807 filed Nov. 30, 2004.

BACKGROUND OF THE INVENTION

1. Field of the invention

The present invention relates to semiconductor devices and methods of controlling the semiconductor devices, and more particularly, to a semiconductor device that has a protecting function against rewrite, and a method of controlling the semiconductor device.

2. Description of the Related Art

As flash memories for storing data, NAND-type memories and AND-type memories are well known. Japanese Unexamined Patent Publication No. 2001-308209 and Japanese Laid-Open Patent Publication No. 2001-518696 disclose examples of NAND flash memories that have floating gates (FG) as charge accumulation layers.

FIG. 1 illustrates the array structure of a conventional FG-type NAND flash memory. In FIG. 1, WL000 through WL031 are word lines that are provided for each unit block, BLn are bit lines, and M are memory cells. The bit lines BLn are connected to page buffers $10_0$ through $10_n$. Every thirty two of the memory cells M are connected in series, so as to form a memory cell array for each bit line BLn by the block. One end of each of the memory cell arrays M000 through M031, . . . , and Mn00 through Mn31 is connected to an array Vss line ARVSS via select source gate SSG00 through SSG0n that respond to the potential of a select line SSG0. The other end of each of the memory cell arrays M000 through M031, . . . , and Mn00 through Mn31 is connected to the bit lines BL0 through BLn via select drain gates SDG00 through SDG0n and drain contacts $22_0$ through $22_n$ that respond to the potential of a select line SDG0. Through select gate control based on an address signal, a desired block is selected, and the other blocks remain unselected.

FIG. 2A is a cross-sectional view of a cell of a FG-type NAND flash memory. FIG. 2B is a cross-sectional view of a select gate. As shown in FIG. 2A, the memory cell M has a structure in which a tunnel oxide film 32, a polycrystalline silicon floating gate 33, an oxide film 34, a nitride film 35, an oxide film 36, and a control gate 37 are stacked in this order on a silicon substrate 31. The threshold value of a FG-type NAND flash memory is set to a negative value in an erasing state (data 1), and is set to a positive value in a writing state (data 0). As shown in FIG. 2B, the select gates SSG and SDG each have a structure in which an oxide film 42 and a gate electrode 43 are stacked in this order on a silicon substrate 41.

In recent years, SONOS (semiconductor-oxide-nitride-oxide-semiconductor)-type NAND flash memories have been developed. In a SONOS-type NAND flash memory, information is stored using a nitride film as a charge accumulation layer, instead of a floating gate. This technique is disclosed in Japanese Unexamined Patent Publication No. 2003-204000. In a SONOS-type non-volatile semiconductor memory, charge injection into a gate insulating film is performed from the source side or the drain side, so that multi-value information can be stored.

Also, in a conventional NAND flash memory, a protecting function against rewrite is provided to prevent the data in the memory cells from being rewritten through a false operation of the chip when the power supply is turned on or off. As a LOW-level signal is supplied to a /WP terminal from the outside, this function inactivates the rewrite circuit (such as a high-voltage generating circuit), thereby prohibiting rewrite in all the cells in the chip.

Meanwhile, a NOR flash memory that is used for storing codes has a function that provides protection against rewrite for each block (sector) unit. In this structure, a protection storing unit (such as a CAM or a latch circuit) for setting protection information against rewrite is provided in a different region from the memory array. When a rewrite instruction is input from the outside, the state machine refers to the data in the protection storing unit corresponding to the block to be rewritten, and performs rewrite or prohibits rewrite in accordance with the data.

In NAND flash memories, there are cases where secret data or code data (programs) are stored in predetermined blocks, and are used when necessary. In such cases, code data or the like are loaded into a RAM (Random Access Memory) from a NAND flash memory, and the data are read out by the host system.

However, a NAND flash memory does not have a protecting function for each block like a NOR flash memory. Because of this, there is a problem that data might be rewritten in accordance with a false rewrite instruction sent from the outside. Also, in a case where a protection storing unit for setting rewrite protection information is employed as in a NOR flash memory, the circuit size becomes larger.

SUMMARY OF THE INVENTION

It is therefore an object of the present invention to provide a semiconductor device and a method of controlling the semiconductor device in which the above disadvantage is eliminated.

A more specific object of the present invention is to provide a semiconductor device that can protect memory cells from false rewrite without an increase in chip size, and a method of controlling the semiconductor device.

The above object of the present invention is achieved by a semiconductor device that includes: groups of memory cells that are connected to word lines; and select gates that are connected to control word lines and the groups of memory cells, each of the select gates being capable of storing protection information for a respective one of the groups of memory cells. In accordance with the present invention, protection information is stored in select gates, so that the memory cell groups can be protected from rewrite, without an increase in chip size.

The memory cells in each of the memory cell groups are connected in series. In accordance with the present invention, the memory cells are connected in series, so as to form a NAND string.

The semiconductor device of the present invention further includes a control circuit that causes the protection information to be stored in the select gates in response to a command. In accordance with the present invention, protection information can be stored in select gates in response to a command.

The semiconductor device of the present invention further includes a voltage supply circuit that supplies, at the time of reading selected memory cells, an associated one of the control word lines with a voltage sufficient to turn ON the select gates. In accordance with the present invention, memory cells can be read, regardless of the protection information stored in the select gates.

The voltage sufficient to turn ON the select gates is approximately equal to a voltage applied to the word lines connected to unselected memory cells among the memory cells.

The semiconductor device of the present invention further includes a voltage supply circuit that supplies, at the time of verifying programming, a corresponding one of the control word lines with a voltage sufficient to turn OFF the select gates if the select gates connected to the corresponding one of the control word lines store the protection information. In accordance with the present invention, at the time of verifying programming of the memory cells, a voltage sufficient to turn OFF the select gates is supplied to a corresponding one of the control word lines, if the select gates corresponding to the corresponding one of the control word lines store the protection information. Thus, the protected block can pass in program verification.

The semiconductor device of the present invention further includes a page buffer that stores data for making a decision of a pass in verification at the time of verifying programming. In accordance with the present invention, the page buffer decides a pass in verification at the time of verifying programming, so that the programming can be regarded as properly completed in all the cells to be programmed on the designated page. Thus, the block can be protected from rewrite.

The semiconductor device of the present invention further includes a voltage supply circuit that supplies, at the time of programming, a corresponding one of the control word lines with a voltage sufficient to turn OFF the select gates if the select gates connected to the corresponding one of the control word lines store the protection information. In accordance with the present invention, at the time of programming, a voltage sufficient to turn OFF the select gates is supplied to a corresponding one of the control word lines, if the select gates connected to the corresponding one of the control word lines store the protection information. Accordingly, the channels of all the cells coupled to the corresponding word lines are boosted, and a pulse is not applied to the cells, which are not to be programmed. Thus, the cells can be protected from rewrite.

The semiconductor device of the present invention further includes: a page buffer that is connected to bit lines; and a control circuit that reads the select gates at the time of performing erasing in the memory cells, and stops the erasing of the memory cells when data read from the page buffer indicates protection. In accordance with the present invention, the cells can be protected from erasing.

The control circuit prepares the protection information for the blocks in response to a command. In accordance with the present invention, in response to a command, protection information can be prepared for the blocks that contain memory cell groups and select gates. The memory cells are of a SONOS type. The select gates include memory cells of a SONOS type. The select gates are select drain gates. The semiconductor device is a semiconductor memory device.

The present invention also provides a method of controlling a semiconductor device, including the step of writing protection information into a select gate that is connected to a group of memory cells and a control word line, the protection information indicating protection of the group of memory cells. In accordance with the present invention, protection information is stored in the select gate, so that the group of memory cells can be protected from rewrite, without an increase in chip size.

The method further includes the step of supplying, at the time of reading the group of memory cells, the control word line with a voltage sufficient to turn ON the select gate. In accordance with the present invention, the memory cells can be read, regardless of the protection information stored in the select gate.

The method further includes the step of supplying, at the time of verifying programming of the memory cells, the control word line with a voltage sufficient to turn OFF the select gate when the select gate stores the protection information. In accordance with the present invention, at the time of verifying programming of the memory cells, a voltage sufficient to turn OFF the select gate is supplied to the control word line, if the select gate stores the protection information. Thus, the protected block can pass in program verification.

The method further includes the step of supplying, at the time of programming of the memory cells, the control word line with a voltage sufficient to turn OFF the select gate when the select gate stores the protection information. In accordance with the present invention, at the time of programming, a voltage sufficient to turn OFF the select gate is supplied to the control word line, if the select gate stores the protection information. Accordingly, the channels of all the cells coupled to the word line are boosted, and a pulse is not applied to the cells, which are not to be programmed. Thus, the cells can be protected from rewrite.

As described so far, the present invention provides a semiconductor device that can protect memory cell groups from rewrite, without an increase in chip size, and a method of controlling the semiconductor device.

BRIEF DESCRIPTION OF THE DRAWINGS

Other objects, features and advantages of the present invention will become more apparent from the following detailed description when read in conjunction with the accompanying drawings, in which:

FIG. 4 is a cross-sectional view of a SONOS-type NAND flash memory;

DESCRIPTION OF THE PREFERRED EMBODIMENTS

The following is a description of preferred embodiments of the present invention, with reference to the accompanying drawings.

First Embodiment

Figure 1:
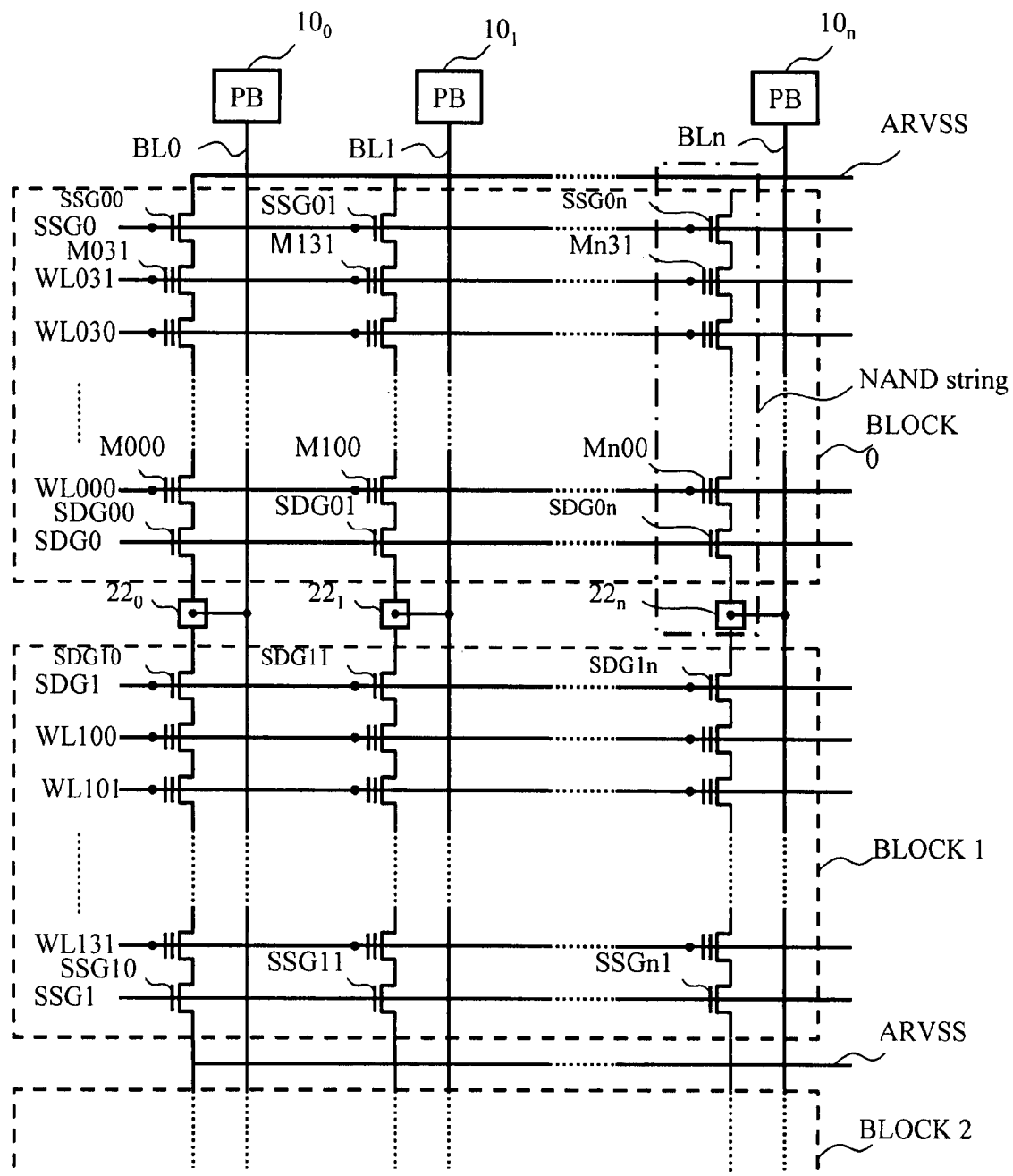
FIG. 1 illustrates the array structure of a conventional FG-type NAND flash memory.
Figure 2A:
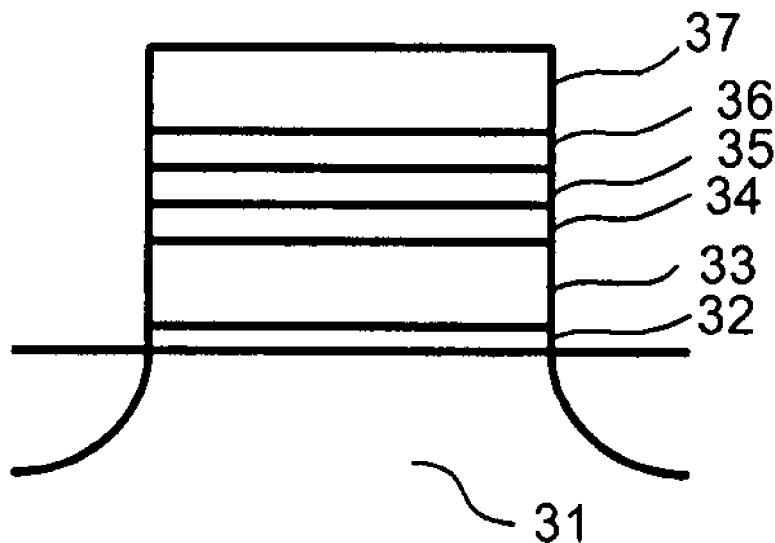
FIG. 2A is a cross-sectional view of a cell of the FG-type NAND flash memory.
Figure 2B:
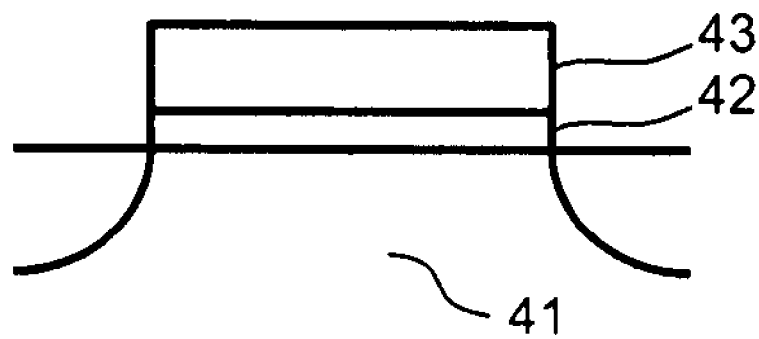
FIG. 2B is a cross-sectional view of a select gate of the FG-type NAND flash memory.
Figure 3:
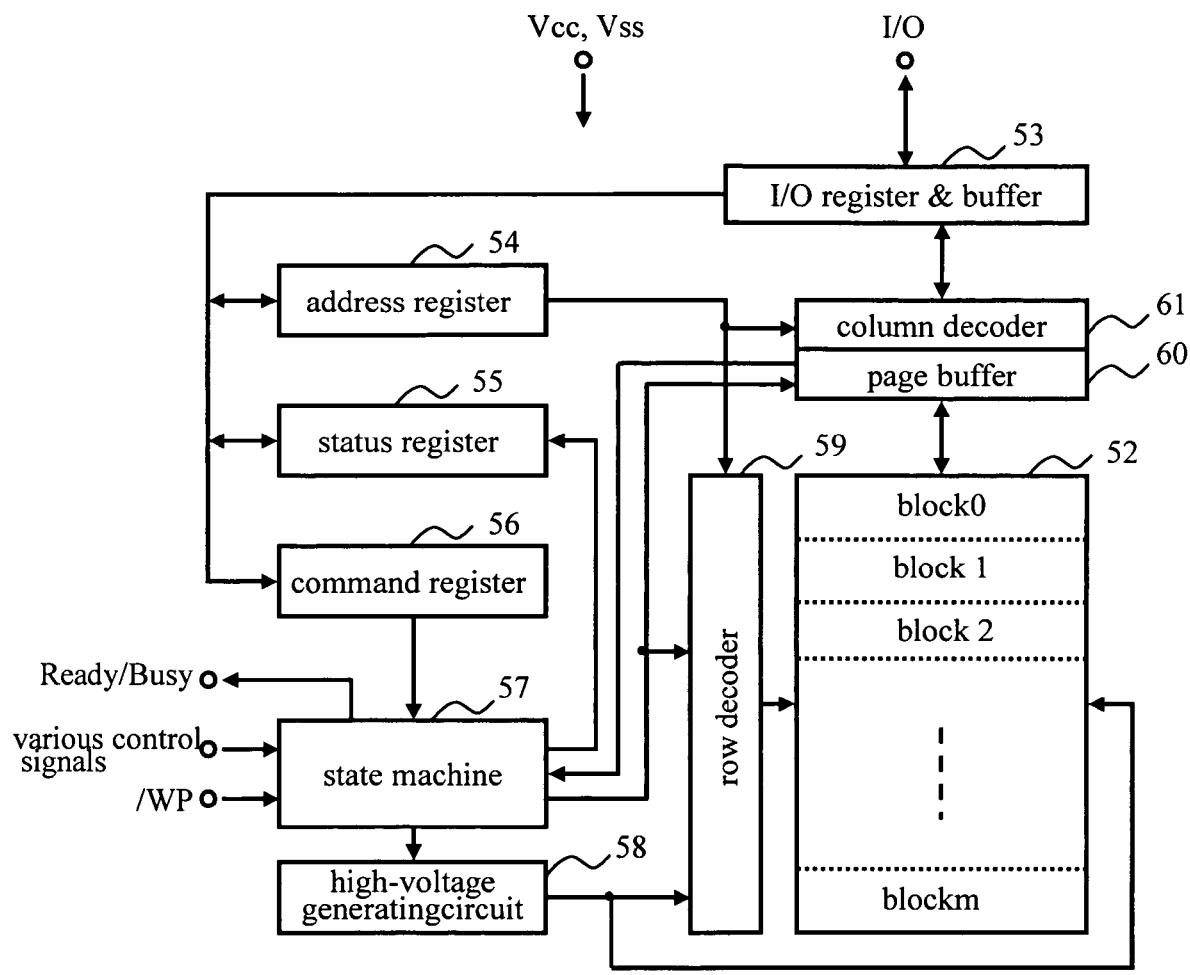
FIG. 3 is a block diagram of a NAND flash memory in accordance with a first embodiment.

FIG. 3 is a block diagram of a NAND flash memory in accordance with the first embodiment. A flash memory 51 includes a memory cell array 52, an I/O register and buffer 53, an address register 54, a status register 55, a command register 56, a state machine 57, a high-voltage generating circuit 58, a row decoder 59, a page buffer 60, and a column decoder 61.

In the memory cell array 52, rewritable non-volatile memory cell transistors are arranged in line with word lines WL and bit lines BL that are arranged in a matrix fashion.

The I/O register and buffer 53 controls various signals or data corresponding to I/O terminals. The address register 54 temporarily stores address signals that are input through the I/O register and buffer 53. The status register 55 temporarily stores status information. The command register 56 temporarily stores operation commands that are input through the I/O register and buffer.

The state machine 57 controls the operation of each circuit in the device in response to each control signal. The high-voltage generating circuit 58 generates high voltages to be used in the device. The high voltages to be used in the device include a data-writing high voltage, a data-erasing high voltage, a data-reading high voltage, and a verifying high voltage to be used for checking whether adequate writing or erasing is performed in the memory cells at the time of data writing or erasing.

The row decoder 59 decodes a row address that is input through the address register 54, and selects the corresponding word line WL. The page buffer 60 includes a data latch circuit and a sense amplifier circuit. The page buffer 60 latches data stored in the memory cells connected to the same word line, and outputs the latched data. The column decoder 61 decodes a column address that is input through the address register 54, and selects column lines. The I/O register and buffer 53, the row decoder 59, the column decoder 61, and the high-voltage generating circuit 58 operate under the control of the state machine 57.

Figure 5A:
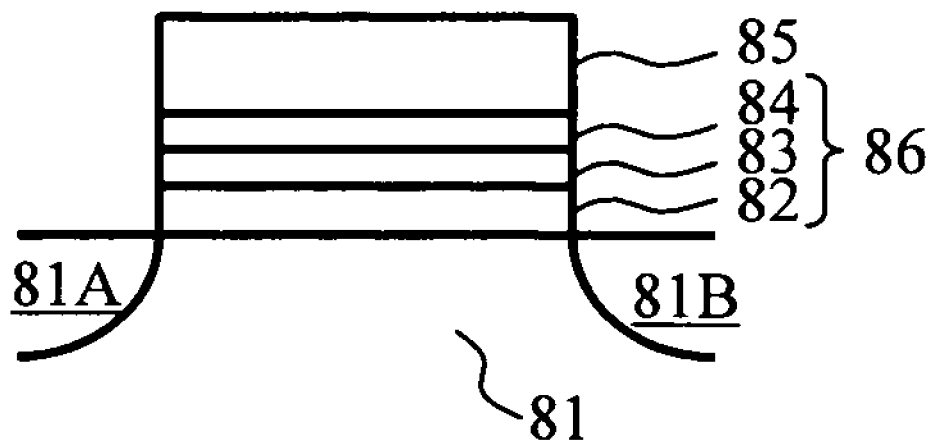
FIG. 5A is a cross-sectional view of a SONOS-type memory cell.
Figure 5B:
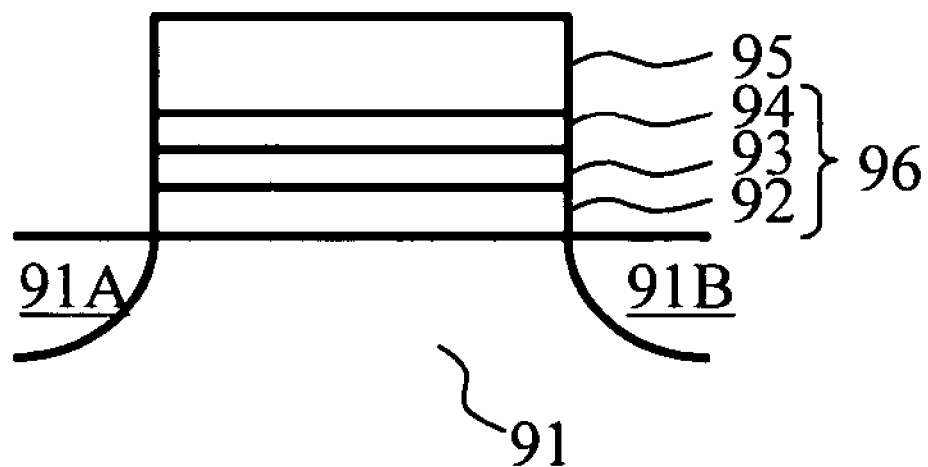
FIG. 5B is a cross-sectional view of a SONOS-type select drain gate.

FIG. 4 is a cross-sectional view of a SONOS-type NAND flash memory in accordance with the present invention. FIG. 5A is a cross-sectional view of a SONOS-type memory cell, and FIG. 5B is a cross-sectional view of a SONOS-type select drain gate. In FIG. 4, M01 through M16 indicate SONOS-type memory cells, BL indicates a bit line, SSG indicates a select source gate, SDG indicates a select drain gate, reference numeral 71 indicates a source diffusion layer, reference numeral 72 indicates a diffusion layer, reference numeral 73 indicates a drain diffusion layer, and reference numeral 22 indicates a drain (bit line) contact. The SONOS-type memory cells M are connected in series, so as to form a NAND string. In this example, 16 SONOS-type memory cells are connected in series. The number of SONOS-type memory cells to be connected in series is not limited to 16, but may be 32.

The select drain gate SDG and the select source gate SSG are connected to both ends of the memory cell string. The select drain gate SDG is of a SONOS type. The select drain gate SDG is connected to the bit line BL via the drain contact 22. The bit line BL is connected to the page buffer 60 shown in FIG. 3. The select drain gate SDG is connected to a control word line and the group of memory cells, and can store protection information for the group of memory cells. The select source gate SSG is formed with an enhanced transistor.

As shown in FIG. 5A, the SONOS-type memory cell transistors M are formed on a silicon substrate 81. In the silicon substrate 81, embedded diffusion regions 81A and 81B are formed as a source region and a drain region. Further, the surface of the silicon substrate 81 is covered with an ONO film 86 that has an oxide film 82, a nitride film 83, and an oxide film 84 stacked in this order. A polysilicon gate electrode 85 is formed on the ONO film 86.

As shown in FIG. 5B, the SONOS-type select drain gate SDG is formed on a silicon substrate 91. In the silicon substrate 91, embedded diffusion regions 91A and 91B are formed as a source region and a drain region. Further, the surface of the silicon substrate 91 is covered with an ONO film 96 that has an oxide film 92, a nitride film 93, and an oxide film 94 stacked in this order. A polysilicon gate electrode 95 is formed on the ONO film 96.

Figure 6:
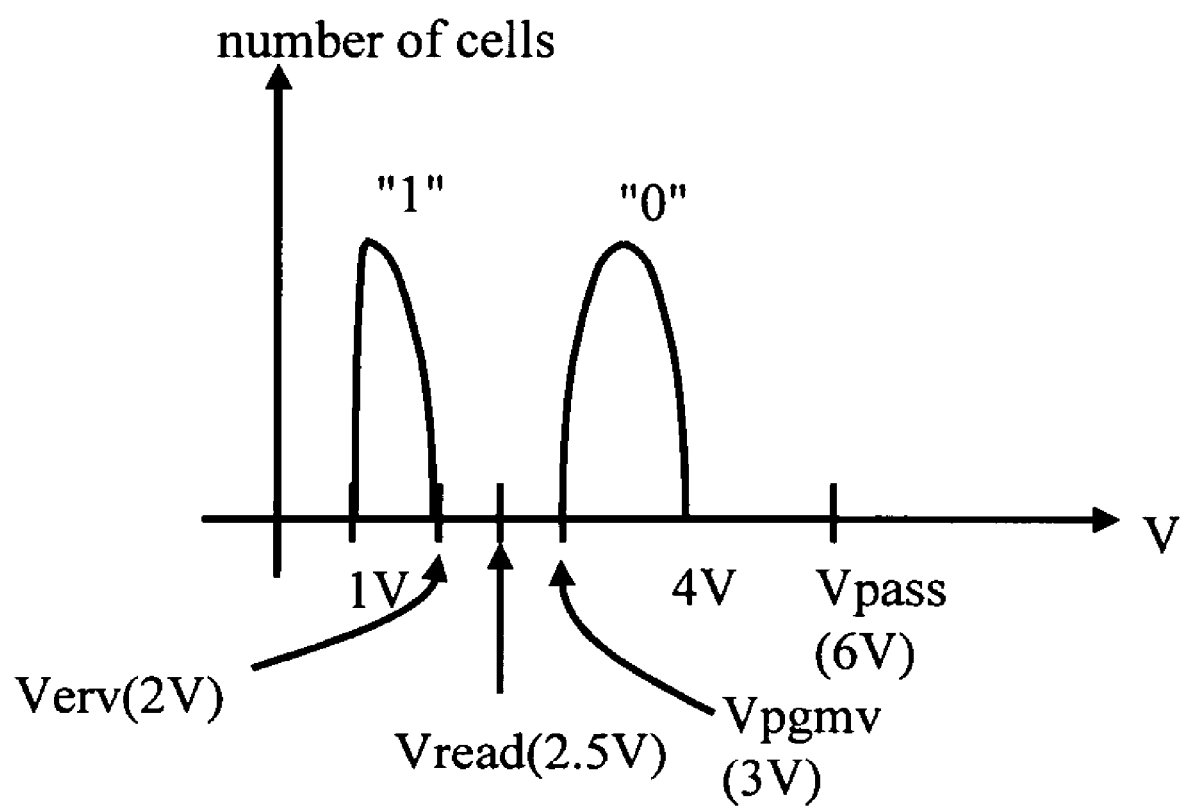
FIG. 6 shows the Vt distribution of a SONOS-type memory cell.

FIG. 6 shows the Vt distribution of the SONOS-type memory cell shown in FIG. 5A. In a SONOS-type memory cell, Vt characteristically reaches saturation at a certain voltage when erasing is performed. The Vt distribution shown in FIG. 6 differs from the Vt distribution of a conventional NAND flash memory. Here, the predetermined voltage is 1V. The voltage Verv to be applied to the selected word line WL at the time of erase verification is 2V, the voltage Vread to be applied to the selected word line WL at the time of reading is 2.5V, the voltage Vpgmv to be applied to the selected word line WL at the time of program verification is 3V, and the voltage Vpass to be applied to unselected word lines WL is 6V.

Figure 7:
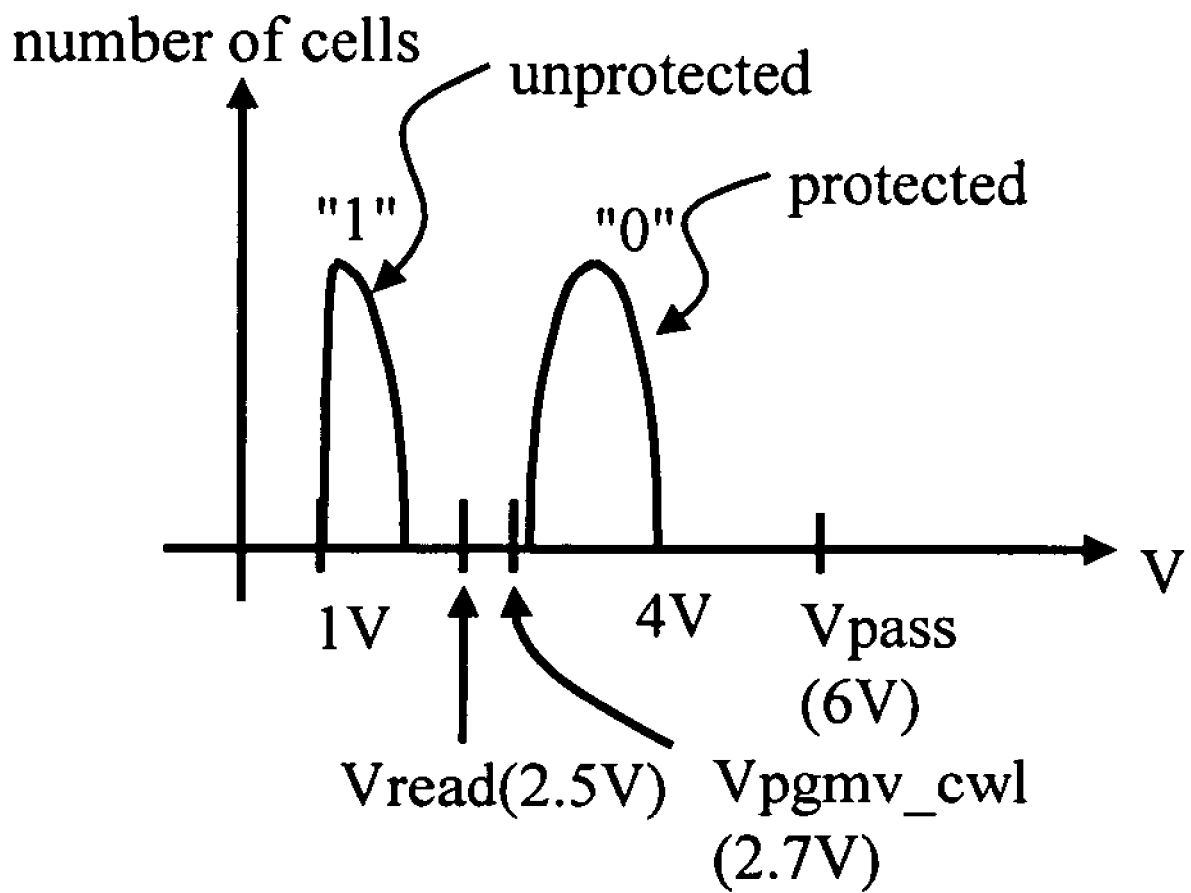
FIG. 7 shows the Vt distribution of a SONOS-type select drain gate that stores information for protecting a block from rewrite.

FIG. 7 shows the Vt distribution of the SONOS-type select drain gate that stores information for protecting a block from rewrite in accordance with the present invention. The select drain gate SDG is formed with a SONOS-type memory cell. As shown in FIG. 7, in a case where the subject block is in an unprotected state, all the select drain gates SDG belonging to the subject block have data 1. In a case where the subject block is in a protected state, the select drain gates SDG have data 0. Thus, a protected state and an unprotected state can be set. Here, the voltage Vread is 2.5V, the voltage Vpgmv_cwl to be applied to the gate electrode of the select drain gates at the time of program verification is 2.7V, and the voltage Vpass is 6V.

Figure 8:
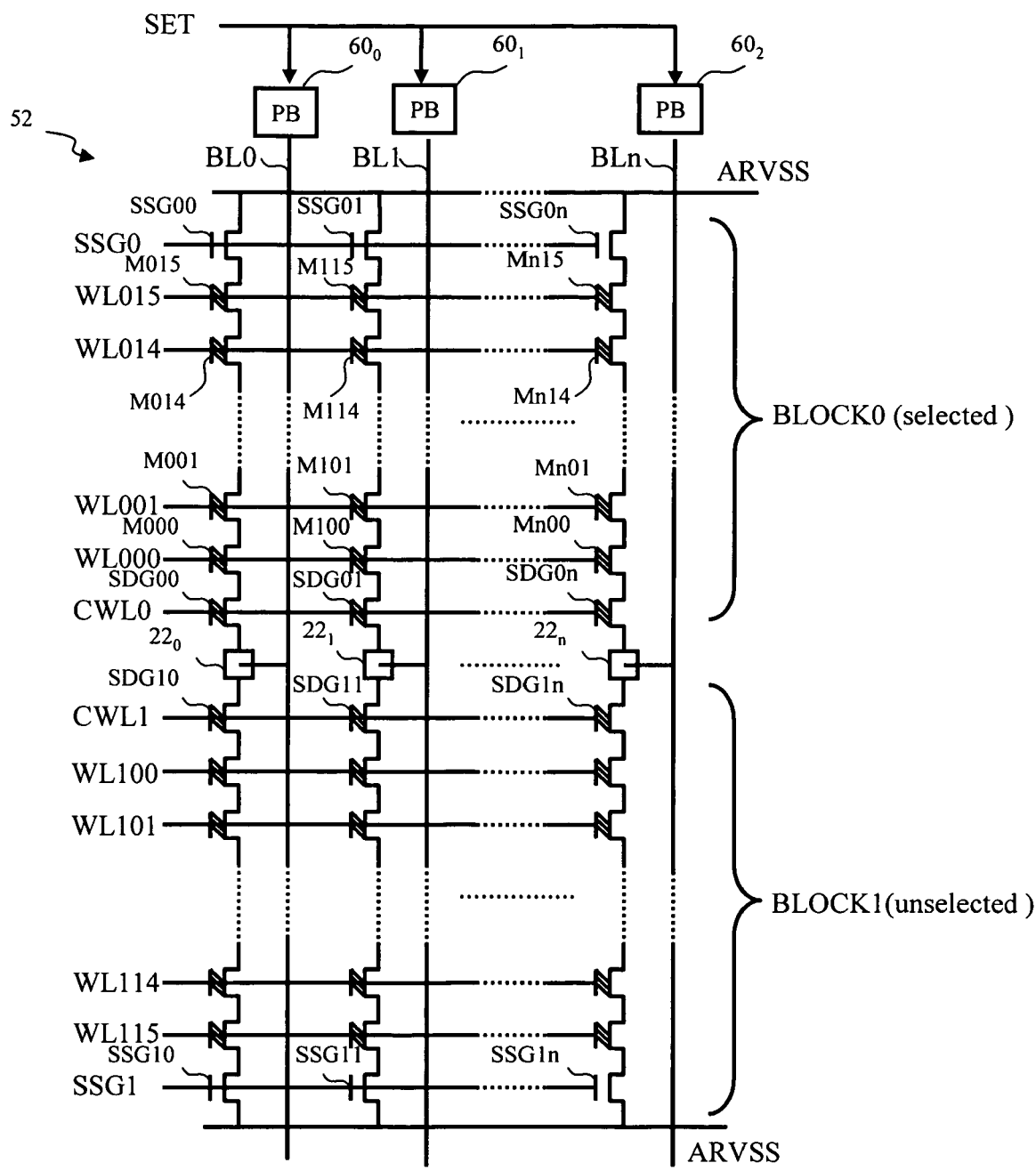
FIG. 8 illustrates a SONOS-type NAND flash memory array.

FIG. 8 illustrates a SONOS-type NAND flash memory array. In FIG. 8, reference numeral 52 indicates the memory cell array, and reference numeral 60*n* indicates a page buffer. Every sixteen SONOS-type memory cells are connected in series, so as to form a NAND string. A select drain gate SDG0*n* and a select source gate SSG0*n* are connected to both ends of each NAND string. The select drain gate SDG0*n* is connected to a bit line BL*n* via a drain contact 22*n*. The bit line BL*n* is connected to the page buffer 60*n*. The n (n being 512 bytes+16 bytes) of NAND strings constitute an erasing unit block.

The n of memory cells connected to one word line WL constitute a page that is an access unit for reading and programming. Accordingly, reading and programming can be performed simultaneously on the n of memory cells. Other blocks are also arranged in the direction of the bit lines BL. Each neighboring two blocks are mirror symmetric about the drain contact 22*n*. A desired block is selected by controlling the corresponding select gate in accordance with an address signal, and other blocks remain unselected. In the example shown in FIG. 8, the block BLOCK0 is the selected block, and the block BLOCK1 is an unselected block.

Figure 9:
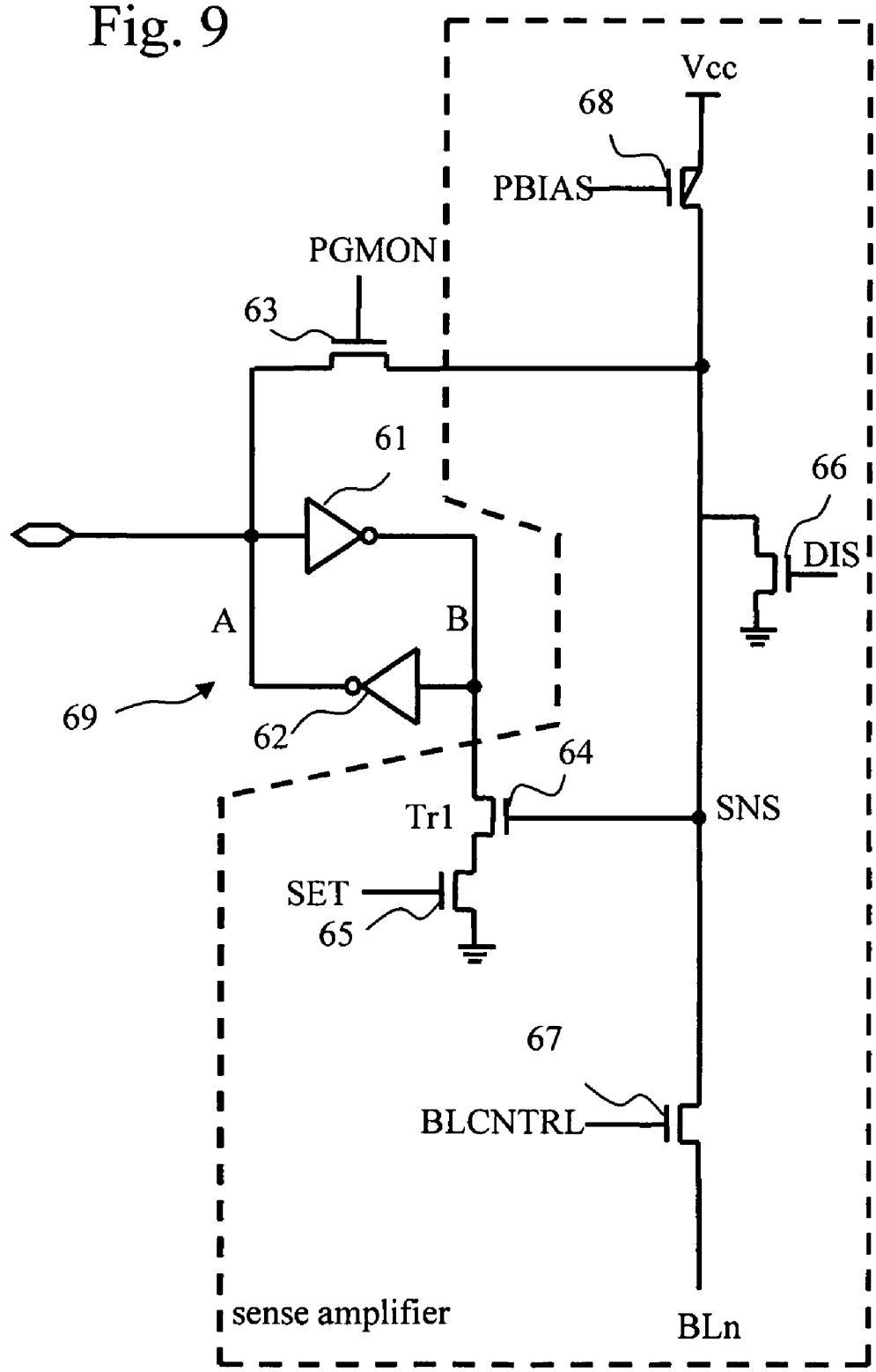
FIG. 9 illustrates the structure of a page buffer.
Figure 10:
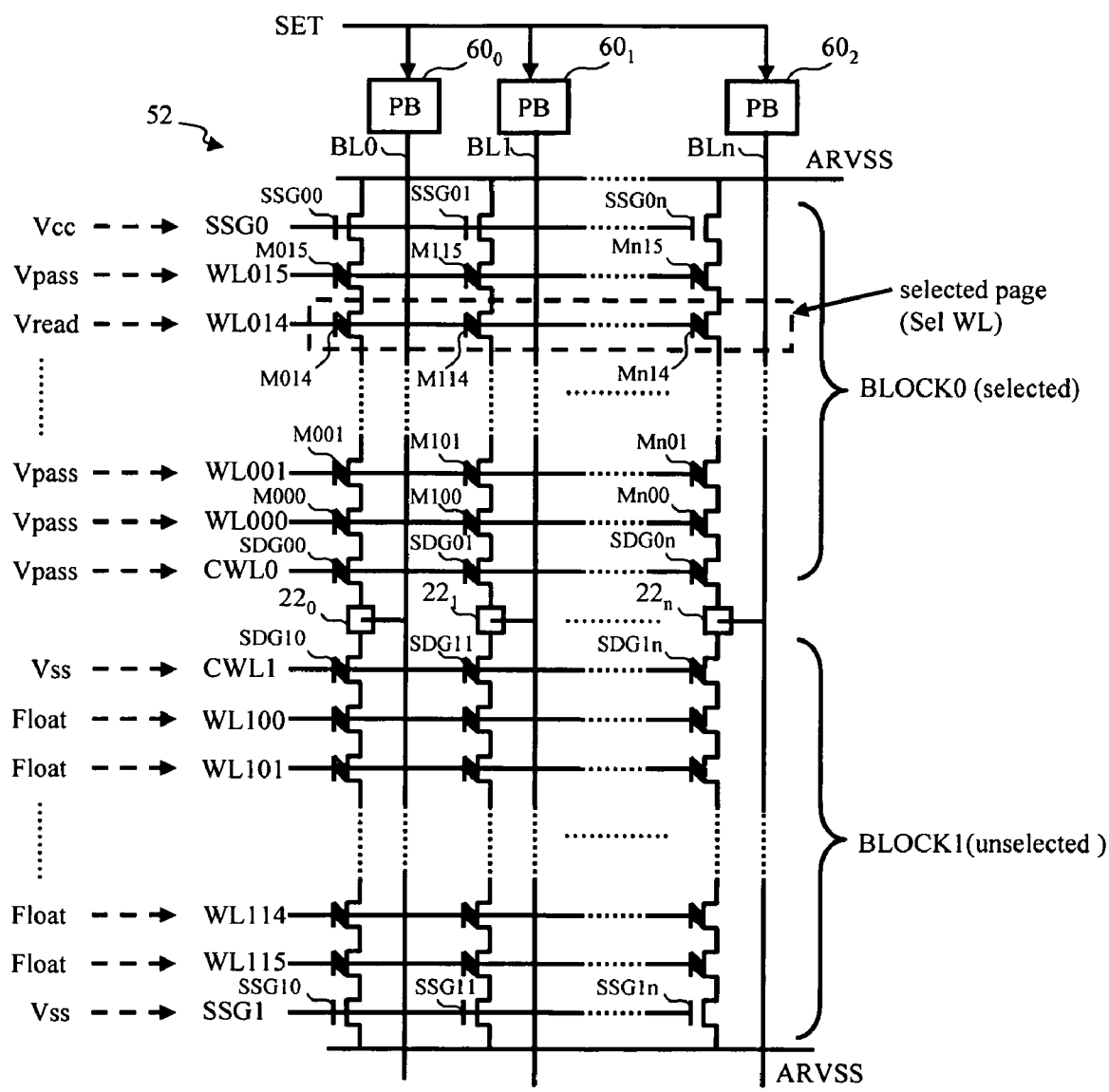
FIG. 10 illustrates a SONOS-type NAND flash memory array and voltage conditions at the time of reading.

FIG. 9 illustrates the structure of a page buffer. The page buffer 60*n* includes inverters 61 and 62, NMOS transistors 63 through 67, and a PMOS transistor 68. The portion surrounded by a broken line is a sense amplifier, and the rest of the structure forms a latch circuit. The gate of the NMOS transistor 65 is controlled by a signal SET supplied from the state machine 57. The NMOS transistor 67 is connected to the bit line BL*n*. This page buffer 60*n* is the same as that of a conventional NAND flash memory. FIG. 10 illustrates the SONOS-type NAND flash memory array 52 and reading voltage conditions. In FIG. 8, reference numeral 52 indicates the memory cell array, and reference numeral 60*n* indicates the page buffer.

Table 1 shows an example of the voltage conditions for reading the memory cells.

TABLE 1

|  | Sel WL | Unsel WL | CWL | SSG | ARVSS | BL |
|---|---|---|---|---|---|---|
| Pre-charge | Vread (2.5 V) | Vpass (6 V) | Vpass (6 V) | 0 V |  | 0 V | 1 V |
| Sense | Vread (2.5 V) | Vpass (6 V) | Vpass (6 V) | Vpass (6 V) | 0 V | sensed |

As shown in Table 1, voltages are applied to the selected word line WL (sel WL), unselected word lines WL (Unsel WL), the control word lines WL (CWL), the select source gates SSG, the array Vss lines ARVSS, and all the bit lines (BL), thereby pre-charging the bit lines BL*n*. A voltage of 2.5V is applied as the voltage Vread to the selected word line WL, while a voltage of 6V is applied as the voltage Vpass to the unselected word lines WL.

At the time of reading, the bit lines BL*n* are set to 1V during the pre-charging. If "data 1" is held during the sensing period, the bit lines BL*n* are discharged to the ground voltage Vss, and, if "data 0" is held, the bit lines BL*n* are maintained at 1V. Here, the cells connected to the word line WL014 (equivalent to one page) are read as shown in FIG. 10. In the page buffer 60*n*, the nodes A and B in a latch 69 formed with the inverters 61 and 62 are set to LOW and HIGH, respectively.

During the pre-charging period, PBIAS is set to the ground voltage Vss, and BLCNTRL is set to such a level (2V, if the threshold value of the transistor 67 that receives the signal BLCNTRL is 1V, for example) as to pre-charge the bit lines BL*n* at a predetermined value (1V, for example). The voltage Vpass (6V) is supplied to the unselected word lines WL, and the memory cells M are turned ON, regardless of the data held therein. In this manner, all the bit lines BL*n* of the selected page is set to the pre-charging level (1V).

The operation then enters the sensing period. At this point, PBIAS is set to the source voltage Vcc, and the select source gates SSG are set to the source voltage Vpass. Since the memory cells with "data 1 (erased state)" among the memory cells on the selected word line WL014 are ON, the bit lines BL*n* connected to those cells are discharged to ARVSS to which the ground voltage Vss is supplied, and the node SNS becomes LOW. Meanwhile, the memory cells with "data 0 (written state)" are OFF. Therefore, the bit lines BL*n* connected to those memory cells are not discharged, and the potential of the node SNS remains HIGH.

Accordingly, the transistor 64 is turned ON only when "data 0" is held. When the signal SET is switched to HIGH, the initial data in the latch 69 is inverted, and the nodes A and B are switched to HIGH and LOW, respectively. When "data 1" is held, the transistor 64 remains OFF, and the initial data are maintained in the latch 69. In this manner, the latched data serve as read data.

Figure 11:
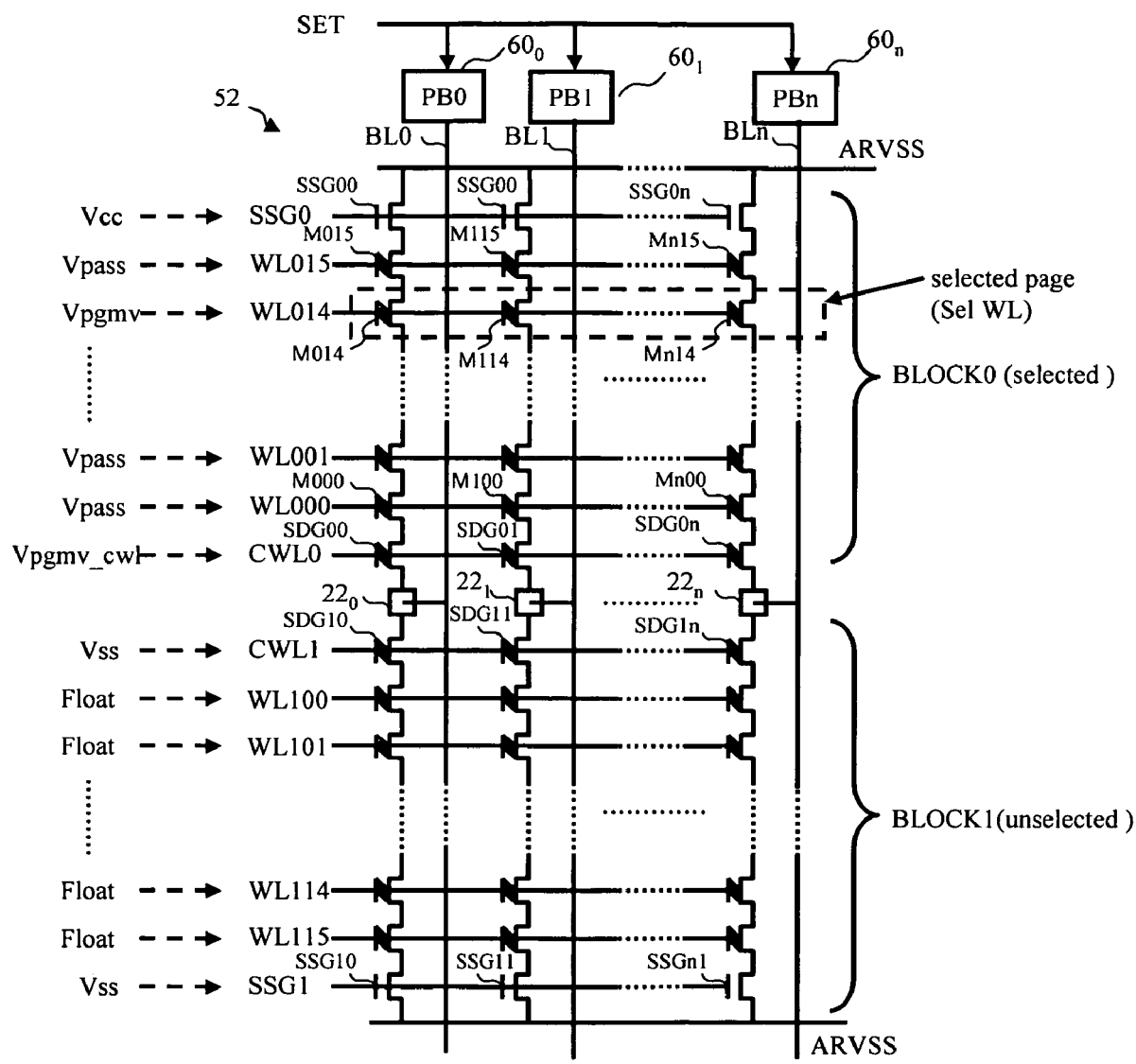
FIG. 11 illustrates a SONOS-type NAND flash memory array and voltage conditions at the time of program verification.

FIG. 11 illustrates the SONOS-type flash memory array 52 and the voltage conditions for program verification (PGMV). Table 2 shows the voltage conditions for program verification and programming (PGM) in a selected block.

TABLE 2

|  | Sel WL | Unsel WL | CWL | SSG | ARVSS | BL |
|---|---|---|---|---|---|---|
| Pre-charge | Vpgmv (3 V) | Vpass (6 V) | Vpass (6 V) | Vss | Vss | 1 V |
| PGM Verify sense | Vpgmv (3 V) | Vpass (6 V) | Vpgmv_cwl (2.7 V) | Vpass (6 V) | Vss | sensed |
| PGM | Vpp (20 V) | Vpass_pgm (10 V) | Vcc-α (2.5 V) | Vss | 1 V (Back bias) | Vcc/Vss |

First, write data are loaded into the latch 69 in the page buffer 60n. When writing is performed in the memory cells M, the latch 69 is set to LOW. When writing is not performed in the memory cells M, the latch 69 is set to HIGH. Program verification is then performed. The basic operation of the program verification is the same as the above described reading operation.

A case where "data 1 (unprotected state)" is held in the select drain gates SDG0n is now described. When program verification is performed on a designated page, voltages are applied to the selected word line WL (sel WL), the unselected word lines WL (Unsel WL), the control word lines (CWL), the select source gates SSG, the array Vss line ARVSS, and all the bit lines (BL), thereby pre-charging the bit lines BLn, as shown in Table 2.

During the first program verification, if all the memory cells M have "data 1", the latched data after the sensing remain unchanged, as the transistor 64 is OFF. Accordingly, the program verification fails, and a program pulse is applied. At this point, a signal PGMON becomes HIGH (the signal PGMON being LOW when the PGM pulse is not being applied), and the data in each latch 69 are supplied to each corresponding bit line BLn. The bit lines BLn corresponding to the memory cells M in which writing is to be performed are set to the ground voltage Vss, and the bit lines BLn of the memory cells M in which writing is not to be performed are set to the source voltage Vss. Accordingly, all the sources and drains in each NAND cell string are set to the source voltage Vss and the voltage Vcc-α-Vt. Here, Vcc-α is a CWL voltage, and Vt is the threshold value of the select drain gates SDG.

In the memory cells M having the sources and drains at the ground voltage Vss, electrons are injected due to tunneling caused by a large potential difference between the memory cells M and the word lines WL after boosting. Writing is then performed. Meanwhile, in the memory cells M having the sources and drains at the voltage Vcc-α-Vt, a back-bias voltage is applied to the select drain gates SDG during the stage of boosting the word lines WL, and the memory cells M are turned OFF. As a result, the sources and drains are put into a floating state, and are boosted together with the word lines WL. Accordingly, a large potential difference is not caused between the word lines WL and the source and drains (a write prohibited state), so that writing is not performed in the memory cells M.

Next, program verification is performed, and at this point, writing has been performed to bring the programmed memory cells M to a sufficiently high threshold value. After the sensing, the bit lines BLn are not discharged. Accordingly, the transistor 64 is turned ON, and the data in the latch 69 are inverted with the signal SET. Although the node A is LOW when writing is being performed, the node A becomes HIGH after sufficient programming. When writing is completed in all the memory cells designated for writing and the node A becomes HIGH, program verification passes, and the series of programming operations are ended.

Next, a case where the select drain gates SDG0n hold "data 0 (a protected state)" is described. If protection is provided for the select drain gates SDG0n, all the select drain gates SDG0n in the subject block hold "data 0". A voltage of 3V is applied as the voltage Vpgmv to the selected work line WL, and a voltage of 6V is applied as the voltage Vpass to the unselected word lines WL. With the voltage Vpass, the unselected memory cells M are turned ON, regardless of the data held in the memory cells M. Accordingly, at least the channels of all the unselected memory cells M are pre-charged to 1V, which is the bit-line potential.

The select source gates SSG0n are then turned ON, and actual program verification (sensing) is started. At this point, the gate voltage of each select drain gate 0n is set to 2.7V as the voltage Vpgm_cwl. During the program verification, the control word lines CWL are set to 2.7V, which is lower than the threshold value of the 0 cell. By doing so, the select drain gates SDG0n are turned OFF, and all the bit lines BLn remain pre-charged, regardless of the data held in the selected memory cells. As the transistor 64 is turned ON, the node A of the latch 69 becomes HIGH while the node B becomes LOW after the sensing. In this latched state, programming is not performed. Thus, program verification passes, and the programming operation comes to an end.

Figure 12:
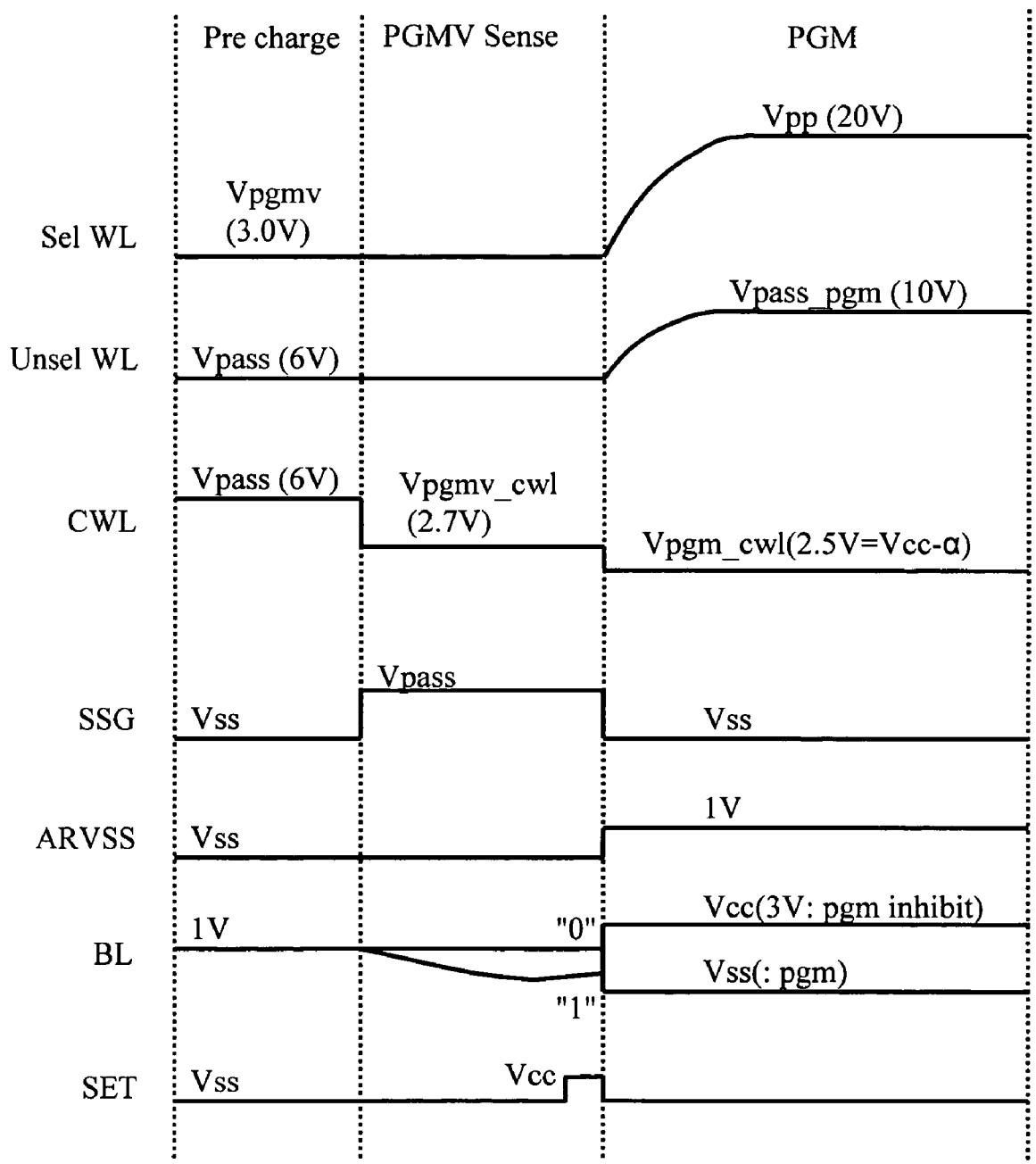
FIG. 12 is a timing chart with respect to PGMV and voltage conditions in the first embodiment.

FIG. 12 is a timing chart with respect to the program verification and the voltage conditions in the first embodiment. As shown in FIG. 12, after a predetermined time has passed, the pulse of the sense signal SET is supplied to the page buffer 60n, and the sensed results are held in the latch 69 in the page buffer 60n. If the block is protected, the select drain gates SDG0n are turned OFF. Therefore, the potential of each bit line BLn is not discharged to ARVSS, and is maintained at 1V. Accordingly, the sense amplifier in the page buffer 60n detects the situation and determines that the verification has passed. Here, programming is not performed. In this manner, the programming is regarded as properly completed in all the cells to be programmed on the designated page, and the subject block is protected from rewrite.

If the subject block is not protected, the select drain gates SDG0n are turned ON. Since the potential of the selected work line WL is set as Vpgmv between "data 1" and "data 0", the bit lines BLn connected to the cells with "data 1" are discharged to ARVSS, and the bit lines BLn connected to the cells with "data 0" are not discharged and maintain 1V as the subject cells are turned OFF. Likewise, each page buffer 60n stores the sensed results in the latch 69. In the next programming operation, based on the latched data, a pulse is applied to each bit with which program verification has failed, and a pulse is not applied to the bits with which program verification has passed. Program verification is again performed, and is repeated until verification passes with respect to all the bits. This control operation is solely performed by the state machine 57.

In this manner, in a case where protection is provided for the subject block, program verification passes prior to program pulse application. Accordingly, the programming is ended at the point, and protection is provided.

Table 3 shows the voltage conditions for program verification and programming for the select drain gates SDG in a write protecting operation to put the subject block into a protected state.

TABLE 3

|  | all WLs | CWL | SSG | ARVSS | all BLs |
| --- | --- | --- | --- | --- | --- |
| Pre-charge | Vpass (6 V) | Vpgmv (3 V) | Vss | Vss | 1 V |
| PGM Verify sense | Vpass (6 V) | Vpgmv (3 V) | Vpass (6 V) | Vss | sensed |
| PGM | Vpass_pgm (10 V) | Vpp (20 V) | Vss | 1 V (Back bias) | Vss |

Figure 13:
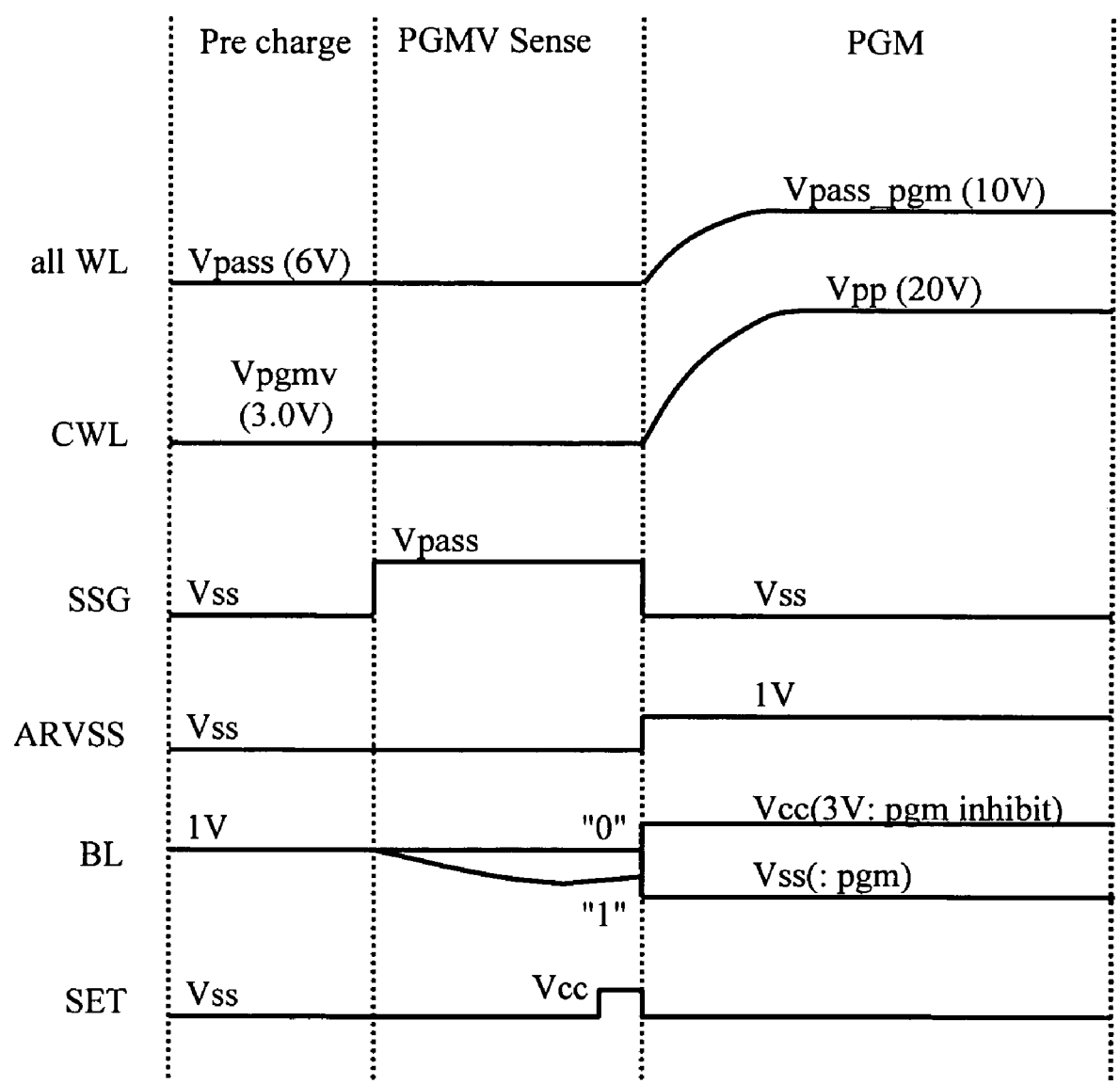
FIG. 13 is a timing chart with respect to program verification for the select drain gate SDG and the program voltage conditions in a write protect operation in the first embodiment.

The write protecting operation is performed by inputting a write protecting command that specifies a desired block address from the outside. FIG. 13 is a timing chart with respect to the voltage conditions for program verification and programming for the select drain gates SDG in the write protecting operation. In FIG. 13, the programming operation for the select drain gates SDG is shown. In this case, the same operation as the operation for the memory cells M should be performed. In the write protecting operation, the programming for the select drain gates SDG is carried out by setting the node A to LOW and the node B to HIGH in the latch 69 of each page buffer 60n, like the programming for the memory cells.

In this embodiment, protection information is stored in the select drain gates SDG, so that the groups of memory cells can be protected from rewrite, without an increase in chip size.

Second Embodiment

Figure 14:
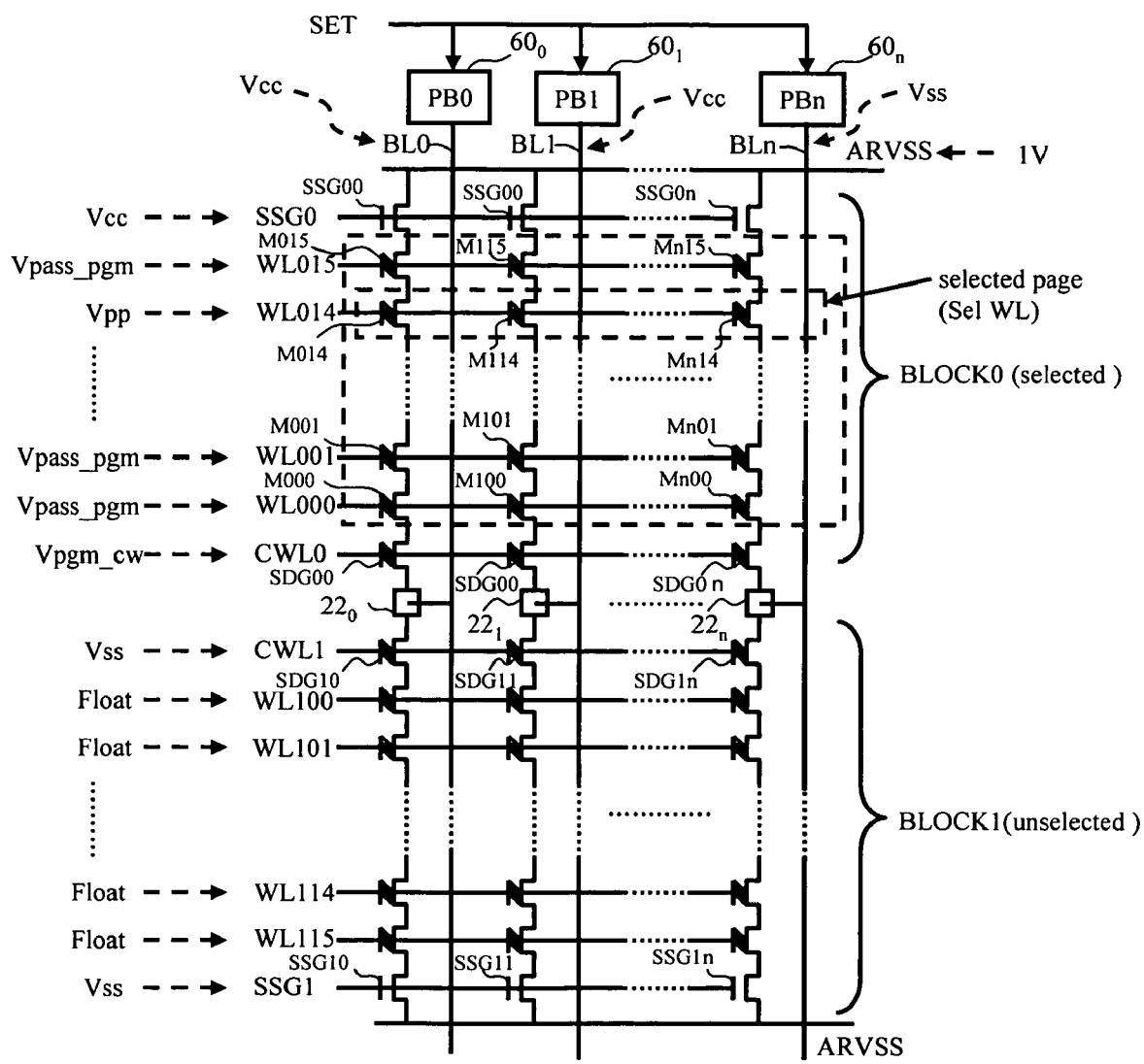
FIG. 14 illustrates a SONOS-type NAND flash memory array and PGM voltage conditions in a second embodiment.
Figure 15:
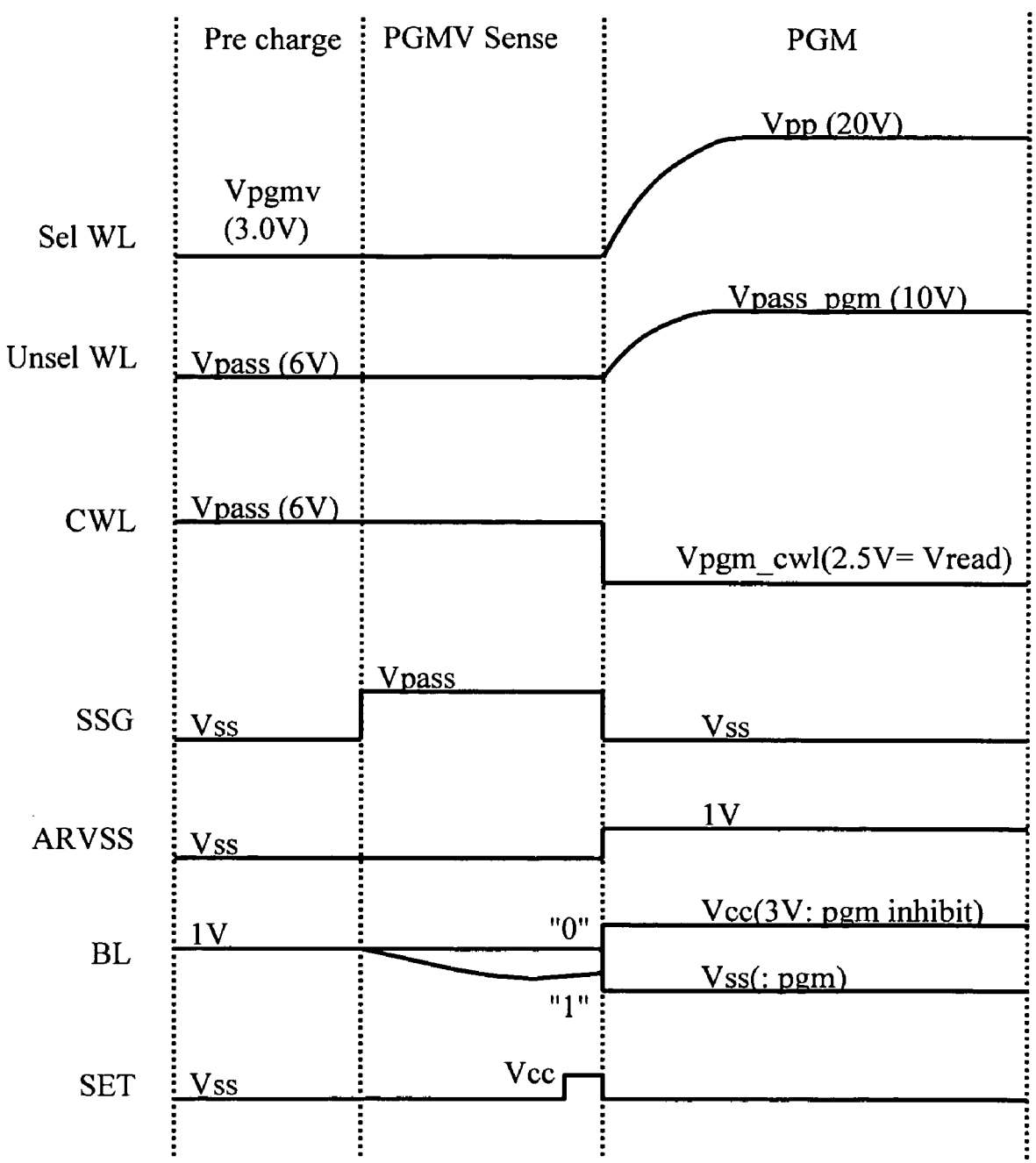
FIG. 15 is a timing chart with respect to program verification and program voltage conditions in the second embodiment.

Next, a second embodiment of the present invention is described. FIG. 14 illustrates a SONOS-type NAND flash memory array and the program voltage conditions in the second embodiment. FIG. 15 is a timing chart with respect to the voltage conditions for program verification and programming in the second embodiment. Table 4 shows the conditions for program verification and programming in a selected block.

0" (a protected state). Thus, the sources and drains of the cells are boosted together with the word lines WL due to coupling.

Accordingly, a program voltage is not applied to the cells, and therefore, programming is not performed in the cells. In this manner, the cells are protected from writing. In the next program verification, the cells in which writing is to be performed still hold "data 1", and therefore, the program verification fails. After program verification and programming are repeated a predetermined number of times, the device hangs and the programming operation comes to an end.

In a case where protection is not provided for the subject block and the select drain gates SDG0n hold "data 1" (an unprotected state), the select drain gates SDG0n are turned ON and OFF in accordance with write data supplied to the bit lines BLn by the page buffer 60n. Thus, desired writing is performed.

Next, an erasing operation in accordance with the present invention is described, with reference to the following table. Table 5 shows the voltage conditions for erasing in accordance with the second embodiment.

TABLE 4

|  | Sel WL | Unsel WL | CWL | SSG | ARVSS | BL |
|---|---|---|---|---|---|---|
| Pre-charge | Vpgmv (3 V) | Vpass (6 V) | Vpass (6 V) | Vss | Vss | 1 V |
| PGM Verify sense | Vpgmv (3 V) | Vpass (6 V) | Vpass (6 V) | Vpass (6 V) | Vss | sensed |
| PGM | Vpp (20 V) | Vpass_pgm (10 V) | Vpgm_cwl 2.5 V | Vss | Vss | Vcc/Vss |

The loading of write data from the outside is the same as that in the first embodiment, and therefore, only the differences between the first embodiment and the second embodiment are described below. In a program verifying period, a voltage of 6V that is the same as the voltage normally applied at the time of reading is applied as Vpass to the control word lines CWL at the time of pre-charging and sensing. By doing so, the control word lines CWL are turned ON through the same procedures as those of the first embodiment, regardless of the data held by the control word lines CWL. Accordingly, the first program verification fails.

When program pulse application starts after the first program verification fails, a voltage of 2.5V is applied as Vpgm_cwl to the control word lines CWL. The voltage applied to the control word lines CWL is the same as the voltage Vread to be applied to the selected word line WL at the time of reading. Accordingly, the control word lines CWL are set to such a voltage that turns ON and OFF the control word lines CWL in accordance with the data held in the select drain gates SDG0n. As the select source gates SSG are turned OFF, with a voltage of 10V being applied as Vpass_PGM to the unselected word lines WL and a voltage of 20V being applied as Vpp to the selected word line WL, the select drain gates SDG0n are OFF, because the voltage Vpgm_cwl (2.5V=Vread) is applied to the control word lines CWL in a case where protection is provided for the subject block and the select drain gates SDG0n have "data

TABLE 5

|  |  | all WLs | CWL | SSG | ARVSS | BL | Well |
|---|---|---|---|---|---|---|---|
| 1st step | Pre-charge | Vpass (6 V) | Vread (2.5 V) | Vss | Vss | 1 V | Vss |
|  | SDG read sense | Vpass (6 V) | Vread (2.5 V) | Vpass (6 V) | Vss | sensed | Vss |
| 2nd step | Pre-charge | Verv (2.0 V) | Vpass (6 V) | Vss | Vss | 1 V | Vss |
|  | ERV sense | Verv (2.0 V) | Vpass (6 V) | Vpass (6 V) | Vss | sensed | Vss |
|  | ER | Vss | Vss | Vss | Float | Float | Vpp (20 V) |

Here, the protection/non-protection information is set in the select drain gates SDG0n, and an erasing instruction is to be input from the outside for a desired block. If protection is provided for the select drain gates SDG0n, all the select drain gates SDG0n in the subject block hold "data 0". As an erasing instruction is input, data is read out from the select drain gates SDG0n (1st step). Accordingly, a voltage 2.5V is applied as Vread to the control word lines CWL, as in the regular case of reading the cells.

If the select drain gates SDG0n are determined to hold "data 0", i.e., protection information is set in the select drain gates SDG0n, as a result of sensing after pre-charging, the state machine 57 detects the information latched in the page buffer 60n, and the erasing operation stopped. Thus, the subject block is protected from erasing. On the other hand, if the select drain gates SDG0n are determined to hold "data 1", i.e., protection information is not set in the select drain gates SDG0n, the erasing operation moves on to a regular erasing verification (2nd step). Based on the result of the erasing verification, an erasing pulse is applied to the subject block.

In this embodiment, prior to regular erasing verification, data are read from the select drain gates SDG, so as to search for the information for protecting the subject block. If protection is provided for the subject block, the erasing operation is stopped on the spot.

In each of the above embodiments, a means of protecting each block from rewrite can be provided in a NAND flash memory, without an increase in chip size (without a CAM or the like especially prepared for the protection). The select gates include select drain gates and select source gates. The row decoder and the high-voltage generating circuit serve as a voltage supply circuit that applies such a voltage as to turn ON the select gates to the control word lines at the time of reading memory cells, a voltage supply circuit that applies such a voltage as to turn OFF the select gates to the control word lines if the select gates hold protection information at the time of program verification of the memory cells, and a voltage supply circuit that applies such a voltage as to turn OFF the select gates to the control word lines if the select gates hold protection information at the time of programming the memory cells. The state machine 57 performs command operations in accordance with various commands from the outside. The state machine 57 is a control circuit that stores protection information in the select drain gates through the command operations. At the time of performing erasing in the memory cells M, the state machine 57 reads data from the select drain gates SDG. If the page buffer 60 determines that the read data are protection information, the state machine 57 serves as a control circuit that stops the erasing in the memory cells M. The state machine 57 also serves as a control circuit that sets protection information in a block containing groups of memory cells and select gates in response to a command.

Although a few preferred embodiments of the present invention have been shown and described, it would be appreciated by those skilled in the art that changes may be made in these embodiments without departing from the principles and spirit of the invention, the scope of which is defined in the claims and their equivalents.

What is claimed is:

1. A semiconductor device comprising:
   groups of memory cells that are connected to word lines; and
   nonvolatile select gates that are controlled by control word lines and are connected to the groups of memory cells, each of the nonvolatile select gates storing protection information for a respective one of the groups of memory cells, wherein the memory cells in each of the memory cell groups comprise transistors connected in series and coupled to corresponding word lines, and wherein each of the nonvolatile select gates comprises a transistor connected in series with a plurality of series-connected transistors of the memory cells.

2. The semiconductor device as claimed in claim 1, further comprising a control circuit that causes the protection information to be stored in the select gates.

3. The semiconductor device as claimed in claim 1, further comprising
   a voltage supply circuit that supplies, at the time of reading selected memory cells, an associated one of the control word lines with a voltage sufficient to turn ON the select gates.

4. The semiconductor device as claimed in claim 3, wherein the voltage sufficient to turn ON the select gates is approximately equal to a voltage applied to the word lines connected to unselected memory cells among the memory cells.

5. The semiconductor device as claimed in claim 1, further comprising
   a voltage supply circuit that supplies, at the time of verifying programming, a corresponding one of the control word lines with a voltage sufficient to turn OFF the select gates when the select gates connected to the corresponding one of the control word lines store the protection information.

6. The semiconductor device as claimed in claim 5, further comprising
   a page buffer that stores data for making a decision of a pass in verification at the time of verifying programming.

7. The semiconductor device as claimed in claim 1, further comprising
   a voltage supply circuit that supplies, at the time of programming, a corresponding one of the control word lines with a voltage sufficient to turn OFF the select gates when the select gates connected to the corresponding one of the control word lines store the protection information.

8. The semiconductor device as claimed in claim 1, further comprising:
   a page buffer that is connected to bit lines; and
   a control circuit that reads the select gates at the time of erasing the memory cells, and stops the erasing of the memory cells when data read from the page buffer indicates protection.

9. The semiconductor device as claimed in claim 2, wherein the control circuit prepares the protection information for the blocks in response to a command.

10. The semiconductor device as claimed in claim 1, wherein the memory cells are of a SONOS type.

11. The semiconductor device as claimed in claim 1, wherein the select gates comprise memory cells of a SONOS type.

12. The semiconductor device as claimed in claim 1, wherein the select gates are select drain gates.

13. A method of controlling a semiconductor device comprising groups of memory cells that are connected to word lines, comprising the step of
   writing protection information into a nonvolatile select gate that is connected to a group of memory cells and a control word line, the protection information indicating protection of the group of memory cells, and further comprising the step of supplying, at the time of reading the group of memory cells, the control word line with a voltage sufficient to turn ON the select gate.

14. The method as claimed in claim 13, further comprising the step of supplying, at the time of verifying programming of the memory cells, the control word line with a voltage sufficient to turn OFF the select gate when the select gate stores the protection information.

15. The method as claimed in claim 13, further comprising the step of supplying, at the time of programming of the memory cells, the control word line with a voltage sufficient to turn OFF the select gate when the select gate stores the protection information.

* * * * *